United States Patent [19]

Szerlip et al.

[11] Patent Number: 5,428,499
[45] Date of Patent: Jun. 27, 1995

[54] PRINTED CIRCUIT BOARD HAVING INTEGRATED DECOUPLING CAPACITIVE CORE WITH DISCRETE ELEMENTS

[75] Inventors: Stanley R. Szerlip, Longmont; Floyd G. Paurus; Archibald W. Smith, both of Boulder, all of Colo.

[73] Assignee: Storage Technology Corporation, Louisville, Colo.

[21] Appl. No.: 10,129

[22] Filed: Jan. 28, 1993

[51] Int. Cl.$^6$ ............................................. H01G 4/38
[52] U.S. Cl. ................................. 361/328; 361/329; 361/330
[58] Field of Search .................... 361/328, 329, 330

[56] References Cited

U.S. PATENT DOCUMENTS 3,304,475  2/1967  Gowen et al. ............... 361/280 X
3,593,107  7/1971  Chilton et al. .............. 361/280 X
4,306,273  12/1981  Maylandt et al. ............ 361/318

*Primary Examiner*—Marvin M. Lateef
*Attorney, Agent, or Firm*—Pennie & Edmonds

[57] ABSTRACT

A printed circuit board laminate is disclosed having a high capacitance power distribution core. The power distribution core comprises a pair of conductive plates electrically connected to an array of high capacitance core tiles, separated by a compliant dielectric filler. The resulting capacitance of the power distribution core is sufficient to eliminate the need for decoupling capacitors on a typical printed circuit board. Separate power supply areas of variable decoupling capacitance can be formed for mounted integrated circuits with different power supply requirements. A method for manufacturing such board laminates is also disclosed that is compatible with standard printed circuit board assembly technology.

22 Claims, 4 Drawing Sheets

5,428,499

PRINTED CIRCUIT BOARD HAVING INTEGRATED DECOUPLING CAPACITIVE CORE WITH DISCRETE ELEMENTS

FIELD OF THE INVENTION

This invention relates generally to printed electronic circuit boards, and more specifically to printed circuit board laminates having an embedded high capacitance power distribution core with discrete capacitive elements, where the core is used as a decoupling capacitor for integrated circuits installed on the printed circuit boards.

BACKGROUND OF THE INVENTION

Printed circuit boards are currently used in practically every type of electronic equipment. A typical printed circuit board (PCB) consists of multiple layers of composites of organic and inorganic materials, with internal and external wiring, allowing electrical components to be mechanically supported and electrically connected. The growing complexity of the electronic circuitry imposed the requirement of allowing greater numbers of components to be installed on a PCB of a given size. The PCB manufacturing technology trend has thus been towards increasing the number of interconnected layers, greater pass-through hole densities, and finer line (trace) widths. The resulting structural compactness provides significant advantages but in addition has created a number of problems.

One such problem is to provide power to the individual integrated circuits mounted on the PCB. In a typical prior art multi-layered PCB, power is supplied to the externally mounted components via a distribution core consisting of a fiberglass/epoxy dielectric element sandwiched between a copper foil power plane and a similar ground plane. Other materials from which the dielectric element is commonly made are Teflon and Polyamide, used to alter the dielectric constant for better signal propagation characteristics. The dielectric constant $\epsilon_r$ of the standard FR-4 fiberglass/epoxy dielectric typically ranges from approximately 4.0 to 5.5 and could be as low as 2 for alternate materials. Such low dielectric constants provide a capacitance of approximately 10 picofarads per square inch or less, which is not sufficient to satisfy the inrush current requirements of a standard integrated circuit.

As a result, typical PCB assemblies require the use of additional, externally mounted decoupling capacitors. Such capacitors, however, occupy considerable PCB surface space, require extra assembly (insertion) time, and increase the overall cost of a completed PCB unit. In addition, each capacitor also constitutes a potential point of failure that reduces the inherent system reliability.

Some of the above-mentioned problems have been addressed in the past. For example, U.S. Pat. No. 4,511,951 to Gottlieb, U.S. Pat. No. 4,532,572 to Schilling, U.S. Pat. No. 4,622,619 to Schilling et al., U.S. Pat. No. 4,630,170 to Kask, and U.S. Pat. No. 4,726,777 to Billman propose improved decoupling capacitors for printed circuit boards. In each case, the decoupling capacitors are built as discrete components, the improvement being in the manufacturing process, in the control of design parameters and the positioning and/or ease of insertion into the board.

Throughout the evolution in PCB technology, however, little progress has been made with respect to building capacitors and other electronic devices as integrated elements during the multilayer PCB manufacturing process. The lack of progress is primarily due to technological problems associated with such integration. It is difficult to integrate components into PCB substrates due to the fact that PCB manufacturing processes and circuit manufacturing processes are basically incompatible in their required cleanliness, thermal cycle, photolithography and other requirements. Thus, most prior art solutions fail to address the problem of eliminating the need for separate components, which reduce the available board space, require separate assembly, reduce inherent reliability and increase the overall cost of the product.

U.S. Pat. No. 5,162,997, which is incorporated herein by reference, makes significant progress in the solution of this problem by integrating a single element high capacitance power distribution core in the PCB manufacturing process. The power distribution core is interconnected with components mounted on either side of the board using standard PCB assembly technology. The high capacitance core consists of a signal ground plane and a power plane separated by a dielectric core element having a high dielectric constant $\epsilon_r$. Using a glass fiber and ferro-electric nano-powder loaded epoxy construction, the power distribution core exhibits a capacitance of approximately 0.1 microfarads per square inch. As a result, a PCB with such high capacitance power distribution core typically requires no additional decoupling for the associated integrated circuits, and thus obviates the need for externally mounted decoupling capacitors.

Notwithstanding the advantages of using this high capacitance power distribution core, it is perceived that the approach has not reached its full potential. In particular, it is often desirable to create a better match between the dielectric, mechanical, thermal expansion and other properties of the materials used in the power distribution core and the remainder of the board. The use of different types of integrated circuits, such as TTL and ECL, on the same board in addition makes it desirable to provide separate areas of variable decoupling capacitance to meet different voltage and/or polarity power supply requirements. Using a single element as a high capacitance power distribution core significantly reduces the designer's flexibility in this respect.

SUMMARY OF THE INVENTION

Accordingly, an object of the present invention is to provide a PCB laminate which has a high capacitance power distribution core with discrete elements. Another object of the present invention is to provide a PCB laminate which has a high capacitance power distribution core with defined separate areas of variable decoupling capacitance to accommodate the power supply requirements of different integrated circuits. It is a further object of the invention to provide a method of manufacturing such PCB laminates which is compatible with standard PCB assembly technology and allows significant manufacturing and usage flexibility. Other objects of the invention will become apparent from the following detailed description.

A PCB laminate in accordance with the present invention comprises a pair of substantially parallel conductive plates electrically connected to an external power source. Sandwiched between these plates is an array of high capacitance core tiles, which are electrically connected to the conductive plates and which are separated from each other by a compliant dielectric filler, filling the space between the core tiles. Each core tile is made of a pair of substantially parallel conductive layers and one or more layers of a dielectric core medium having a dielectric constant $\epsilon_r$ in the range of 3,000 to 20,000.

The compliant dielectric filler typically has a low dielectric constant, advantageous in the case of drilling feed-through and connection holes. Varying the size of the core tiles and the distance between them allows adjustment within certain limits of the effective dielectric constant of the power distribution core and thus the resulting capacitance. In addition, the compliant filler can be selected to have appropriate mechanical, thermal expansion and other properties so as to achieve the desired rigidity, stress resistance, heat dissipation and dimensional stability in the entire board.

The power distribution core of the present invention can provide high capacitance because the individual high capacitance core tiles can be connected in parallel. Typically, there is sufficient capacitance to obviate the necessity for external decoupling capacitors for the PCB. Additional one or two-sided etched conductive layers, separated by insulating layers, can be laminated to each side of the power distribution core using standard PCB assembly technology.

In accordance with the present invention, if integrated circuits with different power supply requirements are to be mounted on the board, separate power supply areas of variable decoupling capacitance which satisfy such requirements can be defined on the power distribution core. Such is for instance the case when ECL, TTL or analog circuits with different voltage and/or polarity requirements are used on the same board as part of the signal path. The separate power supply areas can be formed by having one or both conductive layers of the power distribution core selectively patterned.

Advantageously, the high capacitance core tiles are made by forming an uniform sheet of a predetermined thickness from a dielectric material having a high dielectric constant. This is followed by plating both surfaces of the sheet with a conductive material and cutting up the plated uniform sheet into a desired number of tiles having predetermined dimensions. Alternatively, the individual core tiles can be formed as separate planar capacitors of appropriate dimensions and dielectric properties.

Manufacturing the PCB laminates according to a preferred embodiment of the present invention typically involves coating a conductive foil, preferably standard ¼ to 2 oz copper foil, with a conductive epoxy or thermoplastic layer. The coating can possibly be patterned in case different power zones are to be formed. The capacitor plane of the power distribution core is next formed by placing the pre-made high capacitance core tiles on the foil in a desired spatial array. The core tiles are further pressed and cured in place. In the following step, the spaces between the core tiles are filled with the compliant insulator material and cured to form the upper surface of the capacitor plane. Finally, this surface is coated with a possibly patterned conductive epoxy layer and a second copper foil is affixed to it which is pressed and cured, forming an integral power distribution core. In an alternative embodiment of the invention, the core tiles are individually soldered to the conductive plates. In a second alternative embodiment the power and ground planes are plated onto a pre-assembled capacitive core containing only the capacitive elements and bonding spacer material.

Since nearly every integrated circuit on a given PCB requires a decoupling capacitor, a very large number of decoupling capacitors is required for printed circuit board assemblies each year. The annual expenditure associated with capacitor purchase, inventory, assembly, testing, etc., amounts to hundreds of millions of dollars. It is clear that the solution in accordance with the present invention, will provide substantial savings and is of great value to the electronic industry.

BRIEF DESCRIPTION OF THE DRAWINGS

These and other advantages, features and objects of the present invention are described in the following description of the preferred embodiment in which.

DETAILED DESCRIPTION OF THE INVENTION

Figure 1:
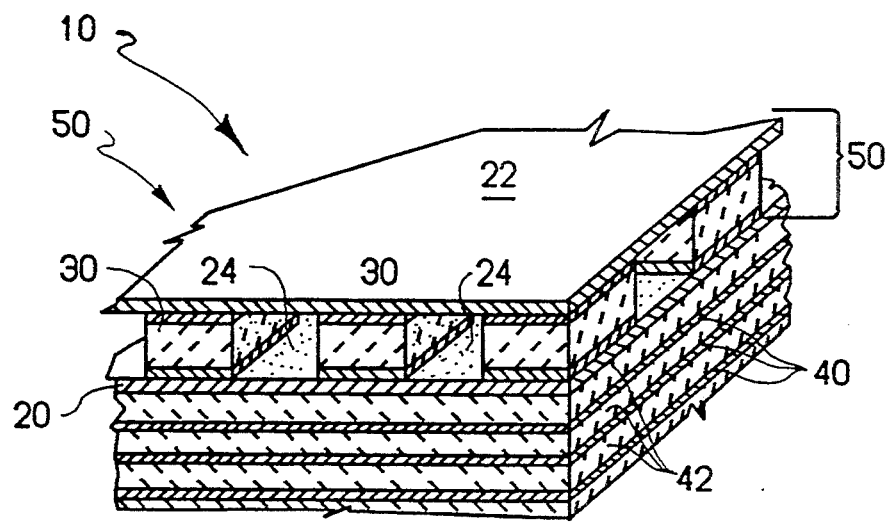
FIG. 1 is a partial perspective view of a PCB laminate having a high capacitance power distribution core with discrete elements in accordance with the present invention.

FIG. 1 shows a novel high capacitance core, multiple-layer PCB laminate 10 in accordance with the present invention. The new PCB laminate uses a high capacitance power distribution core 50 having an effective dielectric constant $\epsilon_r$ greater than that of a typical prior art fiberglass/epoxy power distribution core by three or more orders of magnitude. The power distribution core 50 comprises a pair of substantially parallel conductive plates 20, 22. The plates 20, 22 are preferably made of a ¼–2 oz copper foil and, in operation, are electrically connected to an external power source, not shown.

In case integrated circuits with different power supply requirements, such as ECL, TTL or analog circuits are to be mounted on the board, either one or both of plates 20, 22 may be etched or patterned to define separate desired power zones. This allows the formation of power supply areas of variable decoupling capacitance which satisfy different voltage and/or polarity power supply requirements.

Between the two conductive plates 20, 22 are mounted, in a close spatial relationship to each other, a plurality of discrete high capacitance core tiles 30. Preferably, core tiles 30 are identical and have a rectangular or square shape which allows for them to be positioned in a regular grid pattern, shown in FIGS. 3 and 4.

Figure 2:
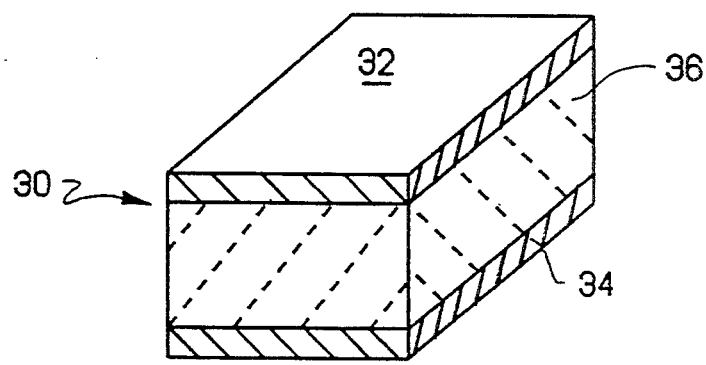
FIG. 2 is a perspective view of a single high capacitance core tile.

In FIG. 2 is shown one high capacitance core tile 30. It comprises one or more layers of a dielectric core medium 36, its top and bottom surfaces being plated with two conductive layers 32, 34. The medium 36 has a dielectric constant $\epsilon_r$ preferably in the range of 3,000 to 20,000. In one embodiment of the present invention the dielectric core medium 36 comprises a glass fiber, impregnated with ferro-electric ceramic bonding material. In a different embodiment, the dielectric core medium 36 comprises a nano-powder loaded electrically insulative material including a pre-fired ceramic powder having a high dielectric constant. A detailed description of these and other available dielectric core media, as well as material composition and methods of fabrication can be found in U.S. Pat. No. 5,162,997.

The gaps between the high capacitance core tiles 30 are filled with a compliant dielectric filler 24 which also fills any space between the tiles 30 and the edges of the power distribution core. The compliant dielectric filler 24 has a dielectric constant which is substantially less than the $\epsilon_r$ of the dielectric core medium 36 and typically is less than 50. Due to its thermoplastic and mechanical properties and wide acceptance, an epoxy such as that used in a FR-4 based PCB can be used as a filler.

As shown in FIG. 1, a number of standard one or two-sided etched copper foil boards 40, separated by insulating layers 42 can be laminated to one or both sides of the power distribution core 50. The desired interconnections between circuit layers are formed by means of standard electroplated feed-through and connection holes (not shown), pre-treated as is well known in the art.

The electrical, mechanical, thermal expansion and other properties of the power distribution core 50 of the present invention depend to a large extent on the properties of the individual core tiles 30 and the manner in which they are interconnected into an array. A detailed description of a single element power distribution core, structurally similar to the individual core tiles of the present invention is found in U.S. Pat. No. 5,162,997. The properties of the entire core 50 are substantially more complex to analyze. Thus, only a qualitative characterization will be given. In particular, due to the parallel connection of the discrete high capacitance core tiles, the overall capacity of the power distribution core 50 can be approximated as the sum of the capacities of all individual components scaled by a factor reflecting the distance between the tiles, the dielectric constant of the filler and the distance between the two conductive plates 20, 22 of the power distribution core 50. Thus, the capacitance of the core can be adjusted as needed by adjusting the layout and hence the distance between tiles or the composition of the filler or, if practical, the distance between plates 20, 22. In addition, individual tiles, or groups of them may be isolated by having the conductive plates 20, 22 patterned for use as circuit elements independent of the decoupling characteristics of the entire power core.

It is well known in the art that PCBs working in different frequency and temperature ranges must be built with different layer materials. For example, in the gigahertz range, the laminate insulator layers for the copper foil are Teflon based. At still higher frequencies (above 3 GHz) a ceramic base material, such as alumina is used and the conductors or circuit elements such as transmission lines are fabricated by a vacuum deposition process. These, and other factors, such as the capacitance mismatch between different materials used in manufacturing the layers in a multi-layer PCB and the power distribution core can also affect the size of the optimal tiles, used in the core 50 according to the present invention.

Figure 3:
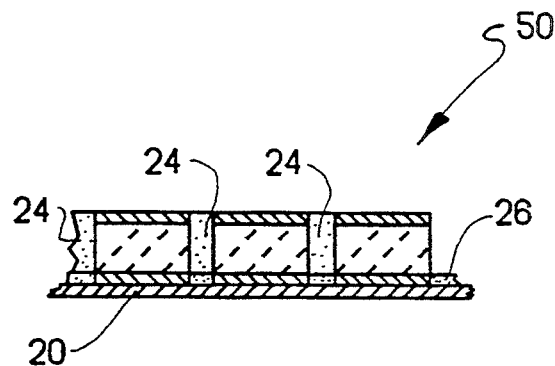
FIGS. 3 is a partial cross-sectional view of the power distribution core.
Figure 4:
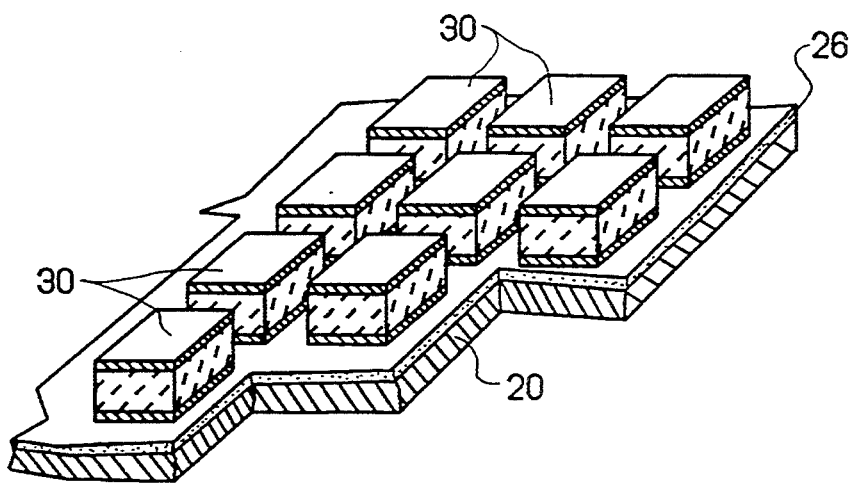
FIG. 4 illustrates the planar arrangement of the core tiles prior to filling the spatial gaps with a dielectric filler.

FIGS. 3 and 4 illustrate a preferred method of manufacturing printed circuit board laminates of the present invention. The high capacitance core tiles 30 are made by forming an uniform sheet of a predetermined thickness from a dielectric material 36 having a high dielectric constant. This is followed by plating both surfaces of the material with a conductive material layers 32, 34 and cutting up the plated uniform sheet into a desired number of tiles having predetermined dimensions. In an alternative embodiment, the core tiles can be manufactured individually.

To form core 50, a conductive foil 20, preferably standard ¼ to 2-oz copper foil, is coated with a conductive epoxy or a conductive thermoplastic layer 26 serving in addition as a bonding material. The capacitor plane of the power distribution core, shown in FIG. 3 is next formed by placing the pre-made high capacitance core tiles 30 onto the foil in a desired spatial array. The core tiles are further pressed and cured in place. In the following step, the spaces between the core tiles are filled with a compliant insulator material 24 and cured to form the upper surface of the capacitor plane. Finally, this surface is coated with a second conductive adhesive layer and a second copper foil 22 (FIG. 1) is affixed to it, forming an integral power distribution core 50. In the case when independent power areas are required, the conductive bonding material is patterned by silkscreen or other methods prior to bonding, curing and final panel etching.

In an alternative embodiment of the present invention the power distribution core is manufactured by soldering the individual core tiles 30 to the conductive foil 20 in a prespecified spatial relationship to each other. Following this step, a compliant dielectric filler 24 is inserted in the gaps between individual tiles. After the filler is cured, an upper foil plate 22 is soldered to the upper conductive layer 32 of the individual tiles to form the power distribution core 50.

In a second alternative embodiment of the present invention the power distribution core is manufactured by fabricating the capacitive core using capacitive tiles 30 bonded together in the proper spatial orientation using an appropriate compliant dielectric spacing material 24. After the power core is cured, the power distribution core is manufactured by plating a possibly patterned foil 20 onto the individual core tiles 30 in a prespecified pattern used to define power zones and discrete capacitive elements. The use of plating techniques enables an easier formation of power zones and discrete capacitive elements in the fabrication of the power core 50.

Figure 5A:
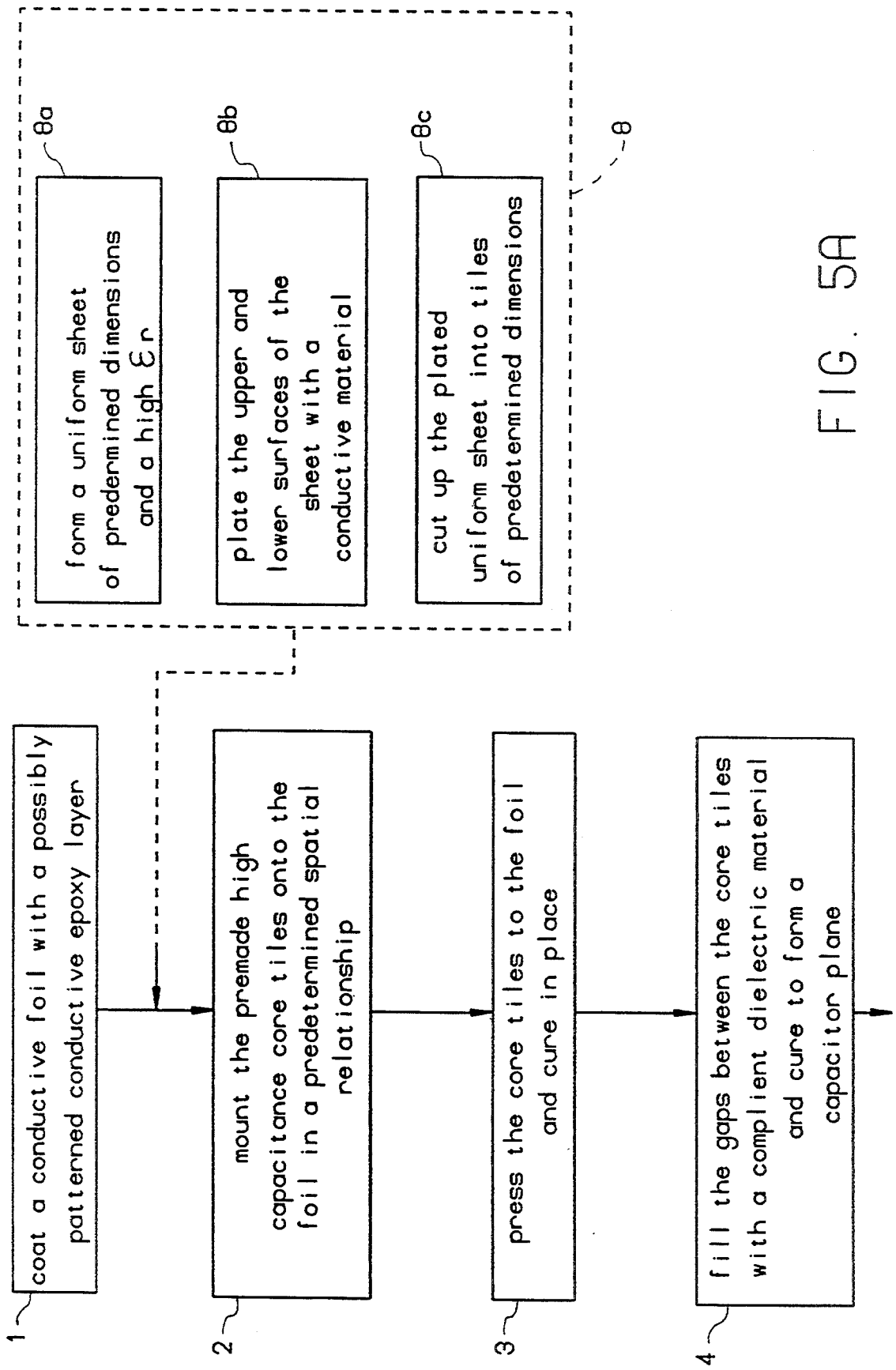
FIGS. 5A and 5B are a flowchart showing the process steps which are performed in constructing the printed circuit board having an embedded high capacitance power distribution core with discrete elements.
Figure 5B:
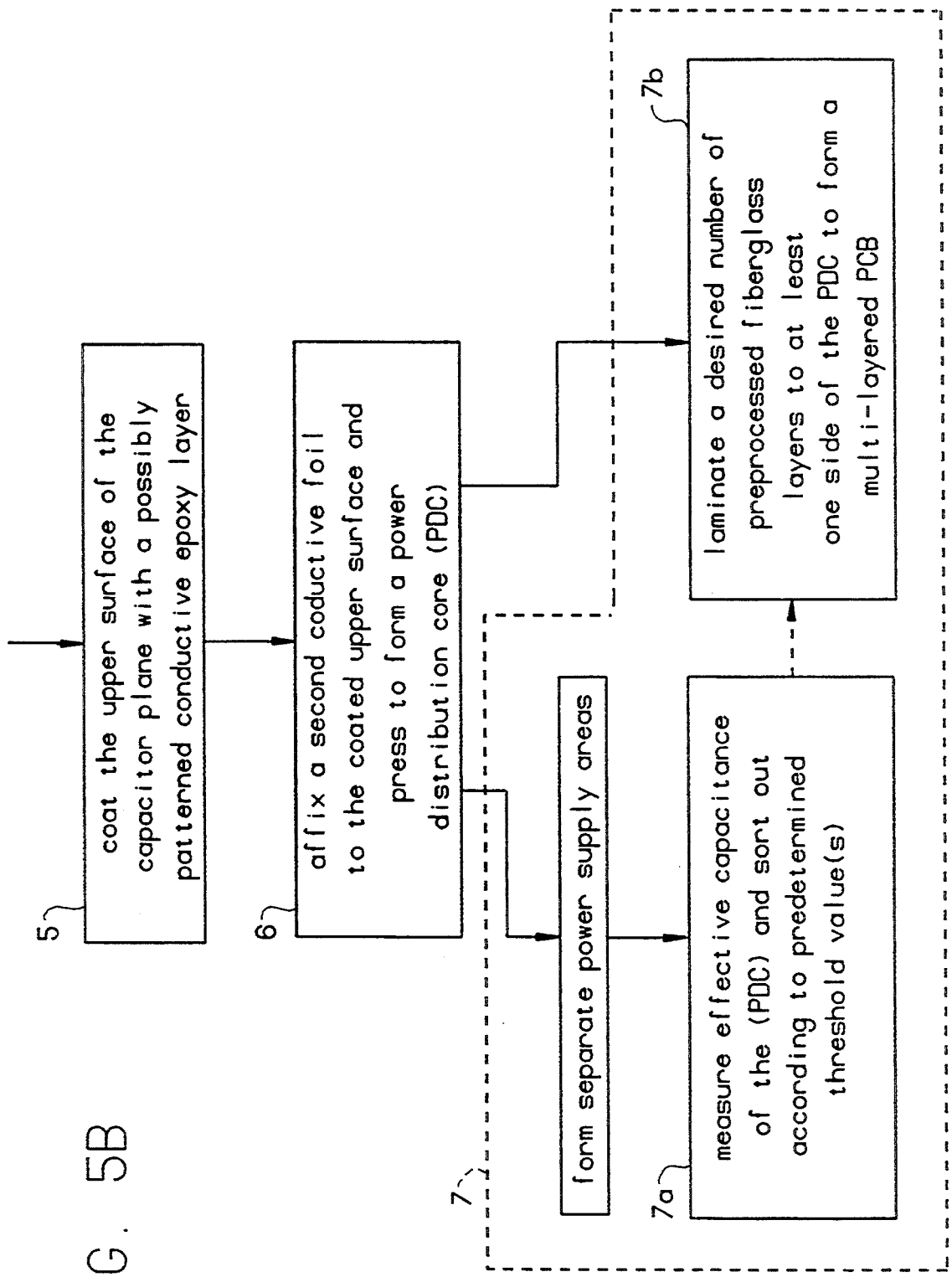

Preferably, the layout of the power distribution core 50 further involves measuring the effective capacitance of the resulting power distribution core and comparing the measured value to a predetermined threshold required to ensure that external decoupling capacitors will not be necessary. In the case when different power areas are formed for different power supply requirements, each power area may be measured separately. The steps of the manufacturing process are illustrated in the flowchart in FIG. 5.

A PCB 10 using a power distribution core 50 with discrete high capacitance tiles 30 in accordance with the present invention is capable of providing an effective capacitance of greater than 0.1 microfarads per square inch, which is an improvement of 3 or more orders of magnitude over the prior art. In addition, the power distribution core 50 gives the manufacturer the flexibility to adjust the mechanical, electrical and thermal characteristics of the materials used in the PCB in an optimal way. Power supply areas with variable decoupling capacitance can be formed on the core to satisfy the power supply requirements of different types of integrated circuits, mounted on the board.

Manufacture of the final PCB with components mounted and soldered is significantly simplified by the fact that the present invention eliminates the need for externally mounted decoupling capacitors. It is clear that implementation of the present invention would not only have a major economic impact in the production of printed circuit boards, but would also result in a substantial progress in electronics system reliability.

It is to be expressly understood that the claimed invention is not to be limited to the description of the preferred embodiment but encompasses other modifications and alterations within the spirit of the inventive concept which scope is defined by the following claims.

What is claimed is:

1. A printed circuit board laminate which comprises:
   a first conductive plate;
   a second conductive plate substantially parallel to said first plate;
   means to electrically connect said first plate and said second plate to an external power source;
   a plurality of high capacitance core tiles positioned between and electrically connected to said first plate and said second plate, said high capacitance core tiles having a predetermined spatial relationship with respect to each other; and
   a compliant dielectric filler positioned between said first plate and said second plate and interposed between said high capacitance core tiles.

2. The printed circuit board laminate according to claim 1 wherein each high capacitance core tile comprises:
   a pair of substantially parallel conductive layers; and
   a dielectric core medium secured between said conductive layers and having a dielectric constant substantially higher than the dielectric constant of said dielectric filler.

3. The printed circuit board laminate according to claim 2 wherein said dielectric core medium comprises an electrically insulative material loaded with pre-fired ceramic nano-powder having a high dielectric constant.

4. The printed circuit board laminate according to claim 2 wherein the dielectric constant $\epsilon_r$ of said dielectric core medium is in the range of approximately 3,000 to 20,000.

5. The printed circuit board laminate according to claim 2 wherein said high capacitance core tiles are identical and have a substantially rectangular shape.

6. The printed circuit board laminate according to claim 5 wherein said high capacitance core tiles are approximately 0.1 inch in width and length and have a distance between the conductive sheets in the range of approximately 0.001 to 0.005 inches.

7. The printed circuit board laminate according to claim 6 wherein said high capacitance core tiles are positioned in a regular grid pattern with a distance of approximately 0.02 inch between adjacent tiles.

8. The printed circuit board laminate according to claim 1 wherein said compliant dielectric filler is a thermoplastic insulator with a dielectric constant of less than about 50.

9. The printed circuit board laminate according to claim 8 wherein said compliant dielectric filler is FR-4.

10. The printed circuit board laminate according to claim 1 wherein said first and second conductive plates are standard ¼-2 oz copper foils.

11. The printed circuit board laminate according to claim 1 wherein at least one of said conductive plates is patterned to define separate power supply areas of variable decoupling capacitance.

12. The printed circuit board laminate according to claim 1 further comprising:
    a plurality of conductive layers laminated to at least one of said first and second conductive plates, said conductive layers being separated by layers of insulation; and
    means for electrically connecting portions of said conductive layers to said first and second conductive plates.

13. The printed circuit board laminate according to claim 11 further comprising:
    a plurality of conductive layers laminated to at least one of said first and second conductive plates, said conductive layers being separated by layers of insulation; and
    means for electrically connecting portions of said conductive layers to said separate power supply areas of variable decoupling capacitance.

14. A method of manufacturing printed circuit board laminates, comprising the steps of:
    coating a first conductive foil with a conductive epoxy layer;
    forming a capacitor plane by mounting a plurality of high capacitance core tiles onto said coated foil, each of said core tiles positioned in a predetermined spatial relationship with respect to the others and having one conductive surface contacting said coated conductive foil;
    filling the spaces between said high capacitance core tiles with a compliant insulator material having a low dielectric constant to form an upper surface of said capacitor plane;
    coating said upper surface of said capacitor plane with a conductive epoxy layer; and
    affixing a second conductive foil to said upper surface to form an integral power distribution core.

15. The method of manufacturing printed circuit board laminates according to claim 14 wherein said coating of at least one of said first and said second conductive foils is patterned.

16. The method of manufacturing printed circuit board laminates according to claim 15 further comprising the step of forming separate areas of variable decoupling capacitance by selectively etching at least one of said first and second conductive plates into predetermined patterns.

17. The method of manufacturing printed circuit board laminates according to claim 14, further comprising the steps of laminating a plurality of conductive layers being separated by layers of insulation to at least one side of said power distribution core and forming means for electrically connecting portions of said conductive layers to said first and second conductive foils to form a multilayered printed circuit board.

18. The method of manufacturing printed circuit board laminates according to claim 16, further comprising the steps of laminating a plurality of conductive layers being separated by layers of insulation to at least one side of said power distribution core and forming means for electrically connecting portions of said conductive layers to said separate areas of variable decoupling capacitance to form a multi-layered printed circuit board.

19. The method of manufacturing printed circuit board laminates according to claim 14 wherein fabricating said plurality of high capacitance core tiles comprises the steps of:

forming an uniform sheet of a predetermined thickness from a dielectric material having a high dielectric constant $\epsilon_r$;

plating the upper and lower surfaces of said uniform sheet with a conductive material; and cutting up said plated uniform sheet into a plurality of identical tiles having predetermined dimensions.

20. The method of claim 19 wherein the tiles are identical.

21. A method of manufacturing printed circuit board laminates, comprising the steps of:

arranging a plurality of high capacitance core tiles into a plane, each of said core tiles positioned in a predetermined spatial relationship with respect to the others;

filling the spaces between said high capacitance core tiles with a compliant insulator bonding material having a low dielectric constant to form a capacitor plane;

curing said capacitor plane;

plating a conductive layer onto the upper and lower surfaces of said cured capacitor plane to form an integral power distribution core.

22. The method of manufacturing printed circuit board laminates according to claim 21 wherein said plated conductive layer of at least one of said upper and lower surfaces is patterned to form separate areas of variable decoupling capacitance.

* * * * *